United States Patent [19]
Kim et al.

[11] Patent Number: 5,843,860
[45] Date of Patent: Dec. 1, 1998

[54] CERAMIC COMPOSITION FOR HIGH-FREQUENCY DIELECTRICS

[75] Inventors: Ho-Gi Kim; Yung Park, both of Seoul, Rep. of Korea

[73] Assignee: Korea Advanced Institute of Science and Technology, Taejon, Rep. of Korea

[21] Appl. No.: 911,466

[22] Filed: Aug. 13, 1997

[30] Foreign Application Priority Data

Aug. 13, 1996 [KR] Rep. of Korea ...................... 96-33523

[51] Int. Cl.$^6$ ................................ L04B 35/49
[52] U.S. Cl. ............................................ 501/134
[58] Field of Search ............................................ 501/134

[56] References Cited

U.S. PATENT DOCUMENTS

| | | | |
|---|---|---|---|
| 4,665,041 | 5/1987 | Higuchi et al. | 501/134 |
| 5,432,134 | 7/1995 | Park et al. | 501/134 |
| 5,561,090 | 10/1996 | Park et al. | 501/134 |

FOREIGN PATENT DOCUMENTS

| | | | |
|---|---|---|---|
| 60-176968 | 9/1985 | Japan | 501/134 |

OTHER PUBLICATIONS

Park, Y., *Influence of Order–Disorder Transition on Microwave Characteristics of Tin Modified Zirconium Titanate*, J. Mater. Sci. Lett., 14:873–875 (1995).

Park, Y. and Kim, Y.H., *Order–Disorder Transition of Tin Modified Zirconium Titanate*, Mater.Res.Bull., 31:7–15 (1996).

Hirano, S. et al., Chemical Processing and Microwave Characteristics of [Zr,sn] TiO4 Microwave Dielectrics, J.Am.Ceram.Soc., 74:1320–1324 (1991).

*Primary Examiner*—David Brunsman
*Attorney, Agent, or Firm*—Knobbe, Martens, Olson & Bear, LLP

[57] ABSTRACT

The present invention provides to a ceramic composition for high-frequency dielectrics which comprises the main ingredients of $ZrO_2$, $SnO_2$ and $TiO_2$ and a subsidiary ingredient of $(Mn(NO_3)_2.4H_2O)$. In accordance with the present invention, a homogeneous ceramic composition can be prepared by a process which comprises the steps of: adding $ZrO_2$, $SnO_2$ and $TiO_2$ by the molar ratio to satisfy $(ZrO_2)_{1-x}(SnO_2)_x(TiO_2)_{1+y}$ (wherein, 0.1M<x<0.4M and 0M<y<0.1M); melting and grinding the mixture at 1900° C. or above; and, adding 1% or less of $Mn(NO_3)_2.4H_2O$ by weight of MnO to the mixture. The ceramic composition of the invention has a high dielectric constant of 40 or more, a quality factor of 7000 or more, and a temperature coefficient of resonance frequency below 10. Accordingly, it can be used for an integrated circuit at microwave as well as at high frequency, or for dielectric resonators.

19 Claims, No Drawings

CERAMIC COMPOSITION FOR HIGH-FREQUENCY DIELECTRICS

FIELD OF THE INVENTION

The present invention relates to a ceramic composition which is used for global positioning systems and dielectric resonators, more specifically, to a ceramic composition for high-frequency dielectrics which comprises the main ingredients of $ZrO_2$, $SnO_2$ and $TiO_2$ and a subsidiary ingredient of $Mn(NO_3)_2 \cdot 4H_2O$.

BACKGROUND OF THE INVENTION

A variety of dielectric ceramic compositions have been applied in the technical fields of high-frequency integrated circuit, dielectric resonators, etc. Nowadays, the high-frequency characteristics are gradually modulated to microwaves, which in turn stands strong needs for dielectric ceramic compositions with a high quality factor(Q) and a high dielectric constant(k) which are correlated to efficiency in performance and to the compactness and lightness of components, respectively.

In this regard, studies have been carried out on the dielectric characteristics of compositions which consist of $TiO_2$, $ZrO_2$ and $SnO_2$ (see: Hirano, S. I. et al., J. Am. Cerm. Soc., 74:1320(1991); Park, Y., J. Mater. Sci. Lett., 14:873 (1995); Park, Y. and Kim, Y. H., Mater. Res. Bull., 31:7 (1996)), and as a result, ceramic compositions with improved characteristics which are prepared to comprise such components as $ZnO$, $Sb_2O_5$, $Nb_2O_5$, $Ta_2O_5$, $WO_3$, etc. in addition to the conventional ones of $TiO_2$, $ZrO_2$, $SnO_2$ and $NiO$, were provided in the art(see: U.S. Pat. Nos. 4,665,041 and 5,432,134). These prior art compositions are, however, proven to be less satisfactory in the senses that: they have a relatively low dielectric constant of below 40 at 7 GHz; and, they cannot be obtained in a homogeneous ones with a small amount of additives. Furthermore, the process for manufacturing the compositions cannot be controlled in a precise manner, since the components are added in oxidized forms.

SUMMARY OF THE INVENTION

The present inventors have made an effort to solve the said problems, and finally, they developed a homogeneous ceramic composition for high-frequency dielectrics which has a high dielectric constant(k) of 40 or more at 7 GHz, a high quality factor(Q) of 7000 or more, and possesses an extremely low temperature coefficient of resonance frequency($\tau_f$) of below 10, which is prepared by a process comprising the steps of melting and grinding $ZrO_2$, $SnO_2$ and $TiO_2$ as the main ingredients at 1900° C. or above, and adding a small amount of $Mn(NO_3)_2 \cdot 4H_2O$ to the mixture.

A primary object of the present invention is, therefore, to provide a ceramic composition for high-frequency dielectrics which comprises $ZrO_2$, $SnO_2$, $TiO_2$ and $Mn(NO_3)_2 \cdot 4H_2O$.

DETAILED DESCRIPTION OF THE INVENTION

In order to prepare a homogeneous ceramic composition of the present invention, the inventors first mixed the main ingredients of $ZrO_2$, $SnO_2$ and $TiO_2$ by the molar ratio to satisfy the following equation:

$$(ZrO_2)_{1-x}(SnO_2)_x(TiO_2)_{1+y}$$

wherein, $$0.1M \leq x \leq 0.4M \text{ and } 0M \leq y \leq 0.1M,$$

while 0.6–0.9M of $ZrO_2$, 0.1–0.4M of $SnO_2$ and 1.0–1.1M of $TiO_2$ are preferred as the composition ratios of ingredients. The mixture was melted at 1900° C. or above, dried and ground. Then, $Mn(NO_3)_{2b} \cdot 4H_2O$ was added to the mixture in an amount of less than 1 wt % by the total weight of MnO, in a non-oxidized form which was dried over 24 hours at a temperature range of 100° to 120° C.

The ceramic composition thus prepared was pressed and sintered under an atmospheric environment at a temperature range of 1200° to 1400° C. Then, measurement of dielectric constant(k) at 7 GHz, quality factor(Q) and temperature coefficient of resonance frequency($\tau_f$) of the sintered sample were followed, respectively. As a result, it was revealed that the composition has a relatively high dielectric constant of 40 or more, a quality factor of 7000 or more, and a relatively low temperature coefficient of resonance frequency of below 10.

When the sintered sample of the invention was compared to those prepared by conventional methods (see: U.S. Pat. Nos. 4,665,041 and 5,432,134), it has been found that the sample has a high sintering density even though it did not undergo a sintering procedure with ZnO and $NiO_2$ which are included in conventional compositions, and it also has a high dielectric constant and a high quality factor.

However, in the ceramic compositions which comprise the main ingredients of $ZrO_2$, $SnO_2$ and $TiO_2$ to satisfy $(ZrO_2)_{1-x}(SnO_2)_x(TiO_2)_{1+y}$, the followings were found that: when x<0.1, the sintering is undesirably performed, and the dielectric constant and the quality factor decrease dramatically; and, when x>0.4, the dielectric constant increases, while the quality factor decreases and the temperature coefficient of resonance frequency increases dramatically. Accordingly, it was demonstrated that the molar ratio of x, i.e., $0.1M \leq x \leq 0.4M$ is critical for obtaining the most preferred ceramic composition to accomplish the object of the present invention.

As explained above, the ceramic composition of the present invention has a dielectric constant of 40 or more, a quality factor of 7000 or more, and a temperature coefficient of resonance frequency below 10, which allows its practical application in an integrated circuit(IC), dielectric resonators, etc., at microwave and at high-frequency as well. Moreover, in accordance with the present invention, the ceramic composition is prepared in a homogeneous one, since it employs a subsidiary ingredient of $Mn(NO_3)_2 \cdot 4H_2O$ in a non-oxidized form which in turn allows a precise control of the process for manufacturing the composition.

The present invention is further illustrated by the following examples, which should not be taken to limit the scope of the invention.

EXAMPLES 1 to 8

In order to prepare ceramic compositions for high-frequency dielectrics, the main ingredients of $ZrO_2$, $SnO_2$ and $TiO_2$ with purities of 99% or more were weighed and mixed according to the composition ratios shown in Table 1 below, melted at 1900° C. or above, dried and ground. Then, a subsidiary ingredient of $Mn(NO_3)_2 \cdot 4H_2$ which was dried at 100° to 120° C. for more than 24 hours was added to the mixture, in an amount equivalent to wt % of MnO according to the ratios shown in Table 1 and mixed for about 2 hours, using a planetary mill employing a nylon jar and zirconium oxide ball, in a dispersion media of distilled water. The mixed slurry thus obtained was dried at a temperature range of 100° to 120° C., to prepare a ceramic composition for high-frequency dielectrics.

In order to examine the characteristics of the compositions prepared as above, samples were taken from the compositions, dry-pressed, and pressed again with a pressure of 1 MPa for each to have a diameter of 10.0 mm and thickness of 4.0, 4.5 or 5.0 mm. Then, the pressed samples were subjected to a sintering procedure at a temperature range of 1200° to 1400° C. under an atmospheric environment, finally to obtain qualified products. After grinding the samples to have smooth surfaces, dielectric constants, quality factors and temperature coefficients of resonance frequency at 7 GHz were measured for each sample by Open Cavity method (see: Kim, Y. et al., Report, N12700(1995)), by using a HP8720C network analyzer (Hewlett-Packard, USA). The results were shown in Table 1 below.

Comparative Examples 1 to 4

Ceramic compositions were prepared in an analogous method to that described in Examples 1 to 8, with an exception of employing ZnO, NiO or $Ta_2O_5$ according to the composition ratios shown in Table 1.

Comparative Examples 5 and 6

Ceramic compositions were prepared by the conventional method in the art (see: U.S. Pat. Nos. 4,665,041 and 5,432,134), and measurement of dielectric constant, quality factor and temperature coefficient of resonance frequency were followed, whose results were summarized in Table 1 below.

$Mn(NO_3)_2 \cdot 4H_2O$ were found to have a very high dielectric characteristics, i.e., it has a high dielectric constant of 46, a quality factor of 9200, and a temperature coefficient of resonance frequency of −1 ppm/°C., when it was sintered at a temperature of 1340° C. Moreover, it was found that: the is compositions of the present invention, even though they did not undergo the sintering procedure with ZnO and NiO, have higher sintering densities than the conventional ones shown in Comparative Examples 5 and 6, and also have very high dielectric constants and quality factors, since amorphous materials promote diffusion during their crystallization in sintering process. The ceramic compositions of Comparative Examples 1 to 4 which fall outside of the composition ratios of the invention, however, had relatively low dielectric constants and quality factors, while the temperature coefficient of resonance frequency increased dramatically.

As clearly illustrated and demonstrated above, the present invention provides a ceramic composition for high-frequency dielectrics which is prepared by melting and grinding the main ingredients of $ZrO_2$, $SnO_2$ and $TiO_2$ at 1900° C. or above, and by adding a subsidiary ingredient of $Mn(NO_3)_2 \cdot 4H_2O$ to the mixture. The present invention provides a homogeneous ceramic composition for high-frequency dielectrics, which has a high dielectric constant of 40 or more, quality factor of 7000 or more, and a temperature coefficient of resonance frequency below 10. Accordingly, it can be used for an integrated circuit at microwave and at high-frequency as well, or for dielectric resonators.

TABLE 1

| | Main Ingredients(M) | | | Additives (% by weight) | | | | Sintering Temperature | | | $\tau_f$ |
|---|---|---|---|---|---|---|---|---|---|---|---|
| | $ZrO_2$ | $SnO_2$ | $TiO_2$ | ZnO | NiO | $Ta_2O_5$ | MnO* | | | | |
| | 1 − X | X | 1 + Y | | | | | (°C.) | k | Q | (ppm/°C.) |
| example 1 | 0.90 | 0.10 | 1.00 | 0.0 | 0.0 | 0.0 | 0.3 | 1320 | 40.5 | 8100 | 8 |
| example 2 | 0.85 | 0.15 | 1.01 | 0.0 | 0.0 | 0.0 | 0.3 | 1320 | 40.0 | 8000 | 6 |
| example 3 | 0.84 | 0.16 | 1.03 | 0.0 | 0.0 | 0.0 | 0.2 | 1350 | 46 | 8200 | 3 |
| example 4 | 0.84 | 0.16 | 1.02 | 0.0 | 0.0 | 0.0 | 0.5 | 1340 | 45 | 8100 | 6 |
| example 5 | 0.82 | 0.18 | 1.03 | 0.0 | 0.0 | 0.0 | 0.25 | 1330 | 45 | 8600 | 6 |
| example 6 | 0.72 | 0.28 | 1.01 | 0.0 | 0.0 | 0.0 | 0.3 | 1360 | 43 | 7900 | −1.5 |
| example 7 | 0.75 | 0.25 | 1.04 | 0.0 | 0.0 | 0.0 | 0.2 | 1340 | 46 | 9200 | −1 |
| example 8 | 0.75 | 0.25 | 1.02 | 0.0 | 0.0 | 0.0 | 0.2 | 1330 | 39 | 8000 | 3 |
| comparative example 1 | 0.97 | 0.03 | 1.00 | 0.3 | 0.1 | 0.1 | 0.0 | 1450 | 32 | 4000 | 100 |
| comparative example 2 | 0.50 | 0.50 | 1.00 | 0.2 | 0.1 | 0.5 | 0.3 | 1300 | 40 | 3000 | 200 |
| comparative example 3 | 0.60 | 0.40 | 0.90 | 0.2 | 0.0 | 0.0 | 0.0 | 1300 | 42 | 4200 | 300 |
| comparative example 4 | 0.80 | 0.20 | 1.00 | 0.0 | 0.0 | 1.0 | 0.0 | 1350 | 37 | 6000 | 4 |
| comparative example 5 | 0.81 | 0.19 | 1.00 | 1.0 | 0.6 | 1.2 | 0.8** | 1320 | 38 | 7800 | 10 |
| comparative example 6 | 0.81 | 0.19 | 1.00 | 2.0 | 0.1 | 1.2 | 1.5** | 1300 | 35 | 4000 | 50 |

*MnO was added in the form of $Mn(NO_3)_2 \cdot 4H_2O$.
**MnO was added in oxidized form.

As can be seen in Table 1, it was clearly demonstrated that: the ceramic compositions of Examples 1 to 8 which were prepared to comprise 0.72 to 0.9M of $ZrO_2$, 0.1 to 0.28M of $SnO_2$, and 1 to 1.04M of $TiO_2$, and 0.5 wt % or less of $Mn(NO_3)_2 \cdot 4H_2O$ (the concentration was calculated by the total weight of MnO), have dielectric constants of 40 or more, quality factors of 7000 or more, and very low temperature coefficients of resonance frequency of 8 or less. Particularly, the composition which comprises 0.75M of $ZrO_2$, 0.25M of $SnO_2$, 1.04M of $TiO_2$ and 0.2wt % of

What is claimed is:

1. A ceramic composition for high-frequency dielectrics which comprises $ZrO_2$, $SnO_2$ and $TiO_2$ in the following molar ratio:

$$(ZrO_2)_{1-x}(SnO_2)_x(TiO_2)_{1+y}$$

wherein, $0.1M \leq x \leq 0.4M$ and $0M \leq y \leq 0.1M$, and a sintering aid component consisting essentially of 1% or less of $Mn(NO_3)_2 \cdot 4H_2O$ by total weight of MnO.

2. A ceramic composition for high frequency dielectrics according to claim 1 wherein wherein x is 0.25, y is 0.04 and the sintering aid component is present in an amount of 0.2 wt. %.

3. The ceramic composition for high-frequency dielectrics of claim 1, which is prepared by a process comprising the steps of: adding $ZrO_2$, $SnO_2$ and $TiO_2$ in said molar ratio to obtain a mixture; melting and grinding the mixture at 1900° C. or above; and adding said sintering aid component.

4. A ceramic composition as defined in claim 1, wherein $$0.1M \leq x \leq 0.25M \text{ and } 0M \leq y \leq 0.04M.$$

5. A ceramic composition as defined in claim 1, wherein the $Mn(NO_3)_2 \cdot 4H_2O$ is from about 0.2% to about 0.5% by total weight of MnO.

6. A ceramic composition as defined in claim 1, wherein dielectric constant of the composition at 7 GHz is above about 39.

7. A ceramic composition as defined in claim 6, wherein dielectric constant of the composition at 7 GHz is from about 39 to about 46.

8. A ceramic composition as defined in claim 1, wherein quality factor (Q) of the composition at 7 GHz is above about 7000.

9. A ceramic composition as defined in claim 8, wherein quality factor (Q) of the composition at 7 GHz is from about 7900 to about 9200.

10. A ceramic composition as defined in claim 1, wherein temperature coefficient of resonance frequency of the composition at 7 GHz is below about 10 ppm/°C.

11. A ceramic composition as defined in claim 10, wherein temperature coefficient of resonance frequency of the composition at 7 GHz is from about 8 ppm/°C. to about −1.5 ppm/°C.

12. A process for preparing a ceramic composition for high-frequency dielectrics, the process comprising:

adding $ZrO_2$, $SnO_2$ and $TiO2$ in the following molar ratio:

$$(ZrO_2)_{1-x}(SnO_2)_x(TiO_2)_{1+y}$$

wherein, $0.1M \leq x \leq 0.4M$ and $0M \leq y \leq 0.1M$;

melting and grinding the mixture at 1900° C. or above; and adding a sintering aid component consisting essentially of 1% or less of $Mn(NO_3)_2 \cdot 4H_2O$ by total weight of MnO.

13. A process as defined in claim 12, wherein $$0.1M \leq x \leq 0.25M \text{ and } 0M \leq y \leq 0.04M.$$

14. A process as defined in claim 12, wherein the $Mn(NO_3)_2 \cdot 4H_2O$ is from about 0.2% to about 0.5% by total weight of MnO.

15. A process as defined in claim 12, wherein dielectric constant of the composition at 7 GHz is above about 39.

16. A process as defined in claim 12, wherein quality factor (Q) of the composition at 7 GHz is above about 7000.

17. A process as defined in claim 12, wherein temperature coefficient of resonance frequency of the composition at 7 GHz is below about 10 ppm/°C.

18. A process for manufacturing a high-frequency dielectric ceramic product, the process comprising the steps of preparing a composition by the method as defined in claim 12 and sintering the composition.

19. A high-frequency dielectric ceramic product manufactured by the process as defined in claim 18.

* * * * *